United States Patent
Tsai et al.

(10) Patent No.: US 7,026,709 B2
(45) Date of Patent: Apr. 11, 2006

(54) STACKED CHIP-PACKAGING STRUCTURE

(75) Inventors: Yu-Fang Tsai, Kaohsiung (TW); Jung-Kun Kang, Kaohsiung (TW); Tsung-Yueh Tsai, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/711,575

(22) Filed: Sep. 25, 2004

(65) Prior Publication Data
US 2005/0023657 A1 Feb. 3, 2005

(30) Foreign Application Priority Data
Apr. 18, 2003 (DE) .................. 921 09 019

(51) Int. Cl.
*H01L 23/02* (2006.01)
*H01L 23/34* (2006.01)
*H01L 29/40* (2006.01)
*H01L 23/12* (2006.01)
*H01L 23/29* (2006.01)

(52) U.S. Cl. ................. 257/686; 257/685; 257/723; 257/784; 257/777; 257/733; 257/787

(58) Field of Classification Search ................ 257/686, 257/685, 723, 784, 777, 778, 733, 787
See application file for complete search history.

(56) References Cited

U.S. PATENT DOCUMENTS

| | | | | |
|---|---|---|---|---|
| 5,783,870 A | * | 7/1998 | Mostafazadeh et al. | 257/791 |
| 5,962,810 A | * | 10/1999 | Glenn | 174/52.2 |
| 6,025,648 A | * | 2/2000 | Takahashi et al. | 257/778 |
| 6,166,444 A | * | 12/2000 | Hsuan et al. | 257/777 |
| 6,586,832 B1 | * | 7/2003 | Shibata et al. | 257/710 |
| 6,653,723 B1 | * | 11/2003 | Manansala | 257/680 |

\* cited by examiner

*Primary Examiner*—Steven Loke
*Assistant Examiner*—Samuel A Gebremariam
(74) *Attorney, Agent, or Firm*—Jianq Chyun IP Office

(57) ABSTRACT

A stacked chip-packaging structure consisting of a plurality of chip-packaging units is provided. Each of the chip-packaging units includes a substrate, a chip, a plurality of wires, a molding compound, and a plurality of solder balls. The chip-packaging units are, for example, of a BGA structure with high pin count, and are stacked up one over another and electrically connected through solder balls. With such structural features, the space that the stacked chip-packaging structure occupies is reduced and consequently the entire structure can be miniaturized.

14 Claims, 3 Drawing Sheets

STACKED CHIP-PACKAGING STRUCTURE

BACKGROUND OF THE INVENTION

1. Field of the Invention

The present invention relates to a chip-packaging structure, and more particularly to a stacked chip-packaging structure.

2. Description of the Related Art

With the progress of highly developed integrated circuit (IC) technologies, integration of internal circuits of IC chips steadily increases. As a result, number of transistors held in internal circuits of IC chips increases relatively, and sectional area of wires in the internal circuits of IC chips reduces accordingly. As the packaging technologies being continuously improved, various chip-packaging structures have been developed, including chip-packaging structures of ball grid array (BGA) structure and of multi-chip packaging module. Wherein, the BGA structure has advantages of high pin count and high reliability, while the multi-chip packaging module has shorter transfer route and better electronic properties. Such technical features make it possible to further reduce the space that the chip-packaging structure occupies, and therefore these packaging technologies could be widely applied in production of electronic devices.

FIG. 1 is a schematic view of a conventional chip-packaging structure. The chip-packaging structure 100, through wire bonding for example, consists essentially of a substrate 110, a chip 120, a plurality of wires 130, a molding compound 140, and a plurality of solder balls 150. The substrate 110 is made of, for example, ceramic, glass, or plastics. The substrate 110 contains alternately stacked multiple conducting layers (not shown) and multiple insulating layers (not shown), while two adjacent conducting layers are separated by an insulating layer, and the conducting layers are electrically connected one another through conductive via or plating through hole. In addition, the top surface 110a and the bottom surface 110b of the substrate 110 have respectively a plurality of upper contacts 112 and a plurality of lower contacts 114, while the upper contact 112 is electrically connected to the lower contact 114 through the conducting layers in the substrate 110. Moreover, a chip 120 is disposed on the top surface 110a of the substrate 110, while the chip 120 has an active surface 122, and a plurality of bonding pads 124 (usually aluminum pads) are disposed on the periphery of the active surface 122. The bonding pads 124 are connected, through wire bonding by the wires 130, to the contacts 112 on the substrate 110, wherein the wires 130 are made of gold, for example.

The wires 130, the chip 120, and the upper contacts 112 on the substrate 110 are enclosed by the molding compound 140 for the protection of the chip 120 and the wires 130. The solder balls 150, made of Sn/Pb alloy for example, are disposed on the lower contacts 114. Wherein, the solder balls 150 serve as contact points of the chip-packaging structure 110 to contact with external electronic devices (e.g., printed circuits or motherboards). The solder balls 150 are disposed in a surface array distribution on the bottom surface 110b of the substrate 110, so that the chip-packaging structure 100 becomes a BGA packaging structure with high pin count.

FIG. 2 shows a conventional multi-chip packaging module. In the packaging structure, a plurality of chip-packaging units, 200(a) and (b) (only two units are shown), are disposed on the same carrier 210, wherein the chip-packaging units 200 are of a BGA type for example, and are sequentially disposed on the carrier 210. Therefore, the chip-packaging units 200(a) and (b) can be electrically connected by internal wires (not shown) of the carrier 210, so as to construct a packaging structure of multi-chip module, such as a dynamic random access memory (DRAM) module.

It is worthy of notice that, when the number of the chip-packaging units increases, the requisite supporting area on the carrier increase accordingly, which makes, for example, the assembled multi-chip packaging module to have a long bar or a flat plate structure. Therefore, it is a challenge to develop appropriate chip-packaging technologies to create certain chip-packaging structures containing more chip-packaging to meet the needs for fabricating a chip-packaging structure with high pin count and a structure of multi-chip packaging module.

SUMMARY OF THE INVENTION

In view of the above, the present invention is directed to provide a stacked chip-packaging structure for stacking multi-chip packaging units on the top of a single chip-packaging unit so as to achieve the purpose of multi-chip packaging.

The present invention is also directed to provide a stacked chip-packaging structure using BGA solder balls to connect the stacked chip-packaging units to obtain a chip-packaging structure having a high pin count.

According to a preferred embodiment of the present invention, the stacked chip-packaging structure consists of a plurality of stacked chip-packaging units, while each of the chip-packaging units includes a substrate, a chip, a plurality of wires, a molding compound, and a plurality of solder balls. Wherein, the substrate has a plurality of upper contacts and a plurality of lower contacts, while the upper contacts are electrically connected to the lower contacts respectively. The chip is disposed on the substrate, and the chip has a plurality of inner contacts and a plurality of outer contacts, while the inner contacts are electrically connected to the outer contacts respectively. In addition, the wires are connected respectively to the upper contacts and the inner contacts, the molding compound covers the wires, the chip and the upper contacts of the substrate, and the molding compound has an opening to expose the outer contacts of the chip. Moreover, the solder balls are respectively connected to the lower contacts, and are connected to one of the outer contacts of the stacked chip-packaging units.

According to the preferred embodiment, the above-mentioned outer contacts are disposed in the central area on the surface of the chip, and the inner contacts are disposed in the periphery area on the surface of the chip. The outer contacts are disposed, for example, in a surface array distribution, the inner contacts are disposed corresponding to the lower contacts, and the lower contacts are also disposed in a surface array distribution in the central area of the surface of the substrate.

In the above-mentioned embodiment, the chip-packaging units are in a BGA packaging structure, and the substrate is made of ceramic, glass or plastics. In addition, the chip has thereon a plurality of bonding pads and a redistribution layer, and the bonding pads are respectively connected, through the redistribution layers, to one of the inner contacts as well as one of the outer contacts.

In conclusion, this invention adopts a BGA structure with a high pin count, wherein the adjacent stacked chip-packaging units are electrically connected through solder balls to reduce the length of connection between the packaging units and thus reduce the probability of signal transferring delay.

In addition, the structural improvements of this invention are useful to reduce the space occupied by the stacked chip-packaging structure.

It is to be understood that both the foregoing general description and the following detailed description are exemplary, and are intended to provide further explanation of the invention as claimed.

DESCRIPTION OF THE PREFERRED EMBODIMENTS

Figure 1:
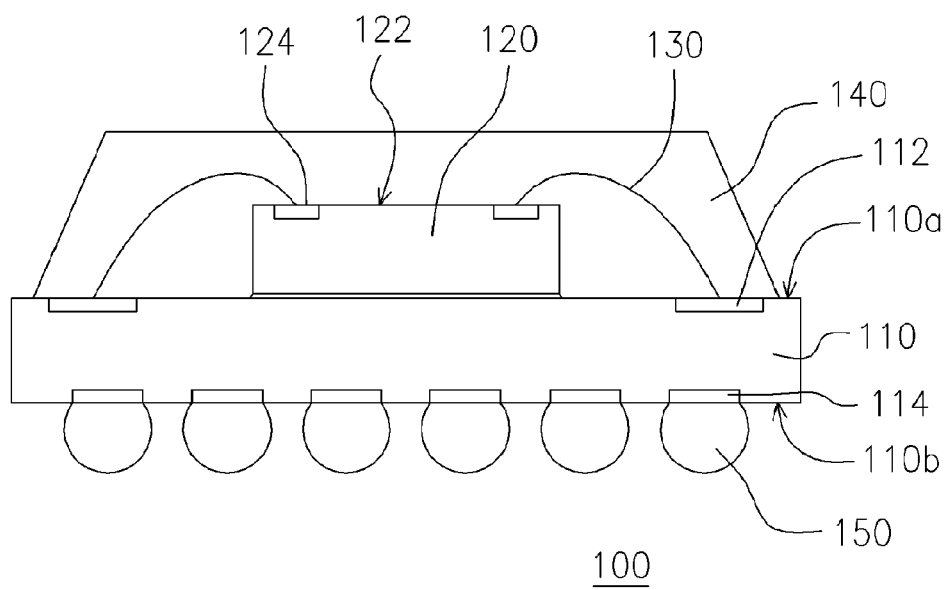
FIG. 1 is a schematic view showing a conventional chip-packaging structure.
Figure 2:
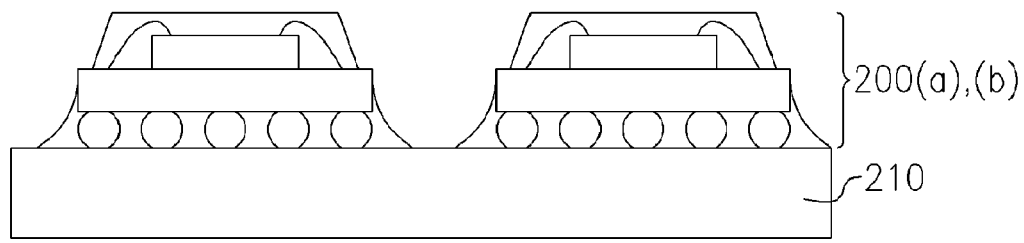
FIG. 2 is a schematic view showing a conventional multi-chip packaging module.
Figure 3A:
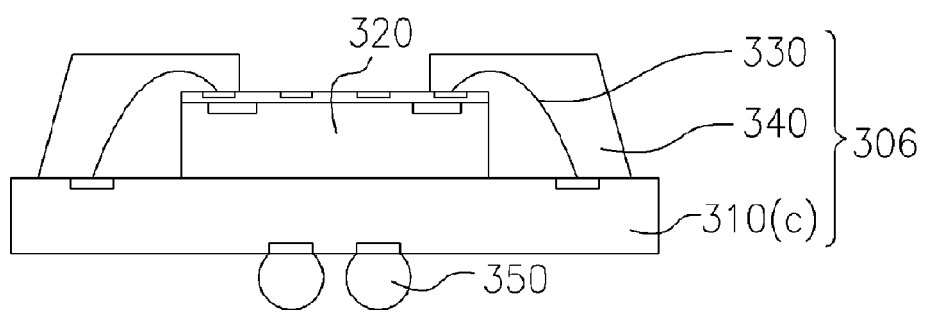
FIGS. 3A and 3B are disassembled and assembled views, respectively, illustrating a stacked chip-packaging structure according to a preferred embodiment of the present invention.
Figure 3A:
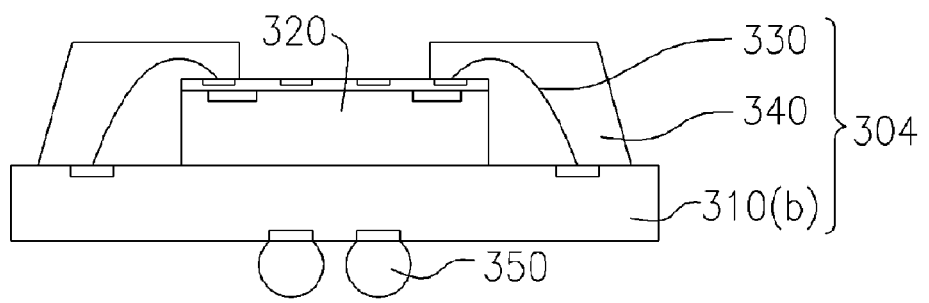
Figure 3A:
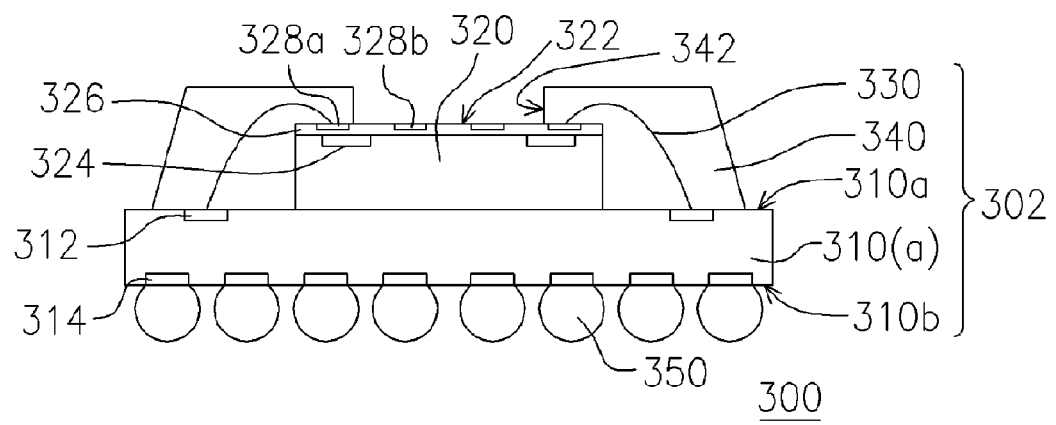

FIG. 3A is a disassembled view showing a stacked chip-packaging structure according to a preferred embodiment of the present invention. The stacked chip-packaging structure 300 consists essentially of a plurality of chip-packaging units 302, 304 and 306, each of which consists essentially of a substrate 310, a chip 320, a plurality of wires 330, a molding compound 340, and a plurality of solder balls 350. Wherein, the substrate 310 is made of, for example, ceramic, glass, or plastics. The substrate 310 has therein alternately stacked multiple conducting layers (not shown) and multiple insulating layers (not shown), while two adjacent conducting layers are separated by an insulating layer, and the conducting layers are electrically connected one another through conductive via or plating through hole. In addition, the top surface 310a and the bottom surface 310b of each of the substrates 310(a), (b) and (c), have respectively at least an upper contact 312 and a lower contact 314, while the upper contact 312 is electrically connected to the lower contact 314 through the conducting layers in the substrate 310.

A chip 320 is disposed on the top surface 310a of the substrate 310, while the chip 320 has an active surface 322, on which a plurality of inner contacts 328a and a plurality of outer contacts 328b are disposed. The inner contacts 328a are disposed, for example, on the periphery of the active surface 322, and the outer contacts 328b are disposed, for example, on the central area of the active surface 322, while one of the inner contacts 328a is electrically connected to one of the outer contacts 328b through internal circuits (not shown) of the chip 320. It is worthy of notice that, in a chip-packaging structure with wire bonding for example, the welding pad 324 of the chip 320 is usually disposed on the periphery of the active surface 322 for convenience in the process of wiring. In this embodiment, the welding pad 324 is designed, for example, through wiring of a redistribution layer 326 so as to be electrically connected to one of the inner contacts 328a and one of the outer contacts 328b, respectively, while the inner contacts 328a and the outer contacts 328b can be disposed respectively on the peripheral surface and the central surface of the redistribution layer 326. In addition, the wires 330, made of gold for example, connects through wire bonding the inner contacts 328a of the chip 320 and the upper contacts 312 of the substrate 310, while the inner contacts 328a and the corresponding upper contacts 312 are disposed in a linear of rectangular distribution. In the design of chip circuits according to this invention, however, bonding pads may be designed to have inner contacts and outer contacts electrically connected to the substrate 310 directly, through the wires 330 but not redistribution layer 326.

In addition, the molding compound 340 encloses the wires 330, the chip 320 and the upper contacts 312 of the substrate 310 to protect the chip 320 and the wires 330. The molding compound 340 has, in the central area thereof, an opening 342 to expose the outer contacts 328b of the chip 320. Moreover, the solder balls 350 are disposed, for example, on the lower contacts 314 of the substrate 310, and is connected to the outer contacts 328b of the chip 320 of another layer, such that the stacked chip units are electrically connected. Wherein, the solder balls 350 are made of welding materials such as Sn/Pb alloy. The outer contacts 328b are disposed, for example, in an array distribution, and the outer contacts 328b are correlated with the lower contacts 314, so that the lower contacts s 314 are disposed, also in an array distribution, on the central surface area of the substrate 310.

Figure 3B:
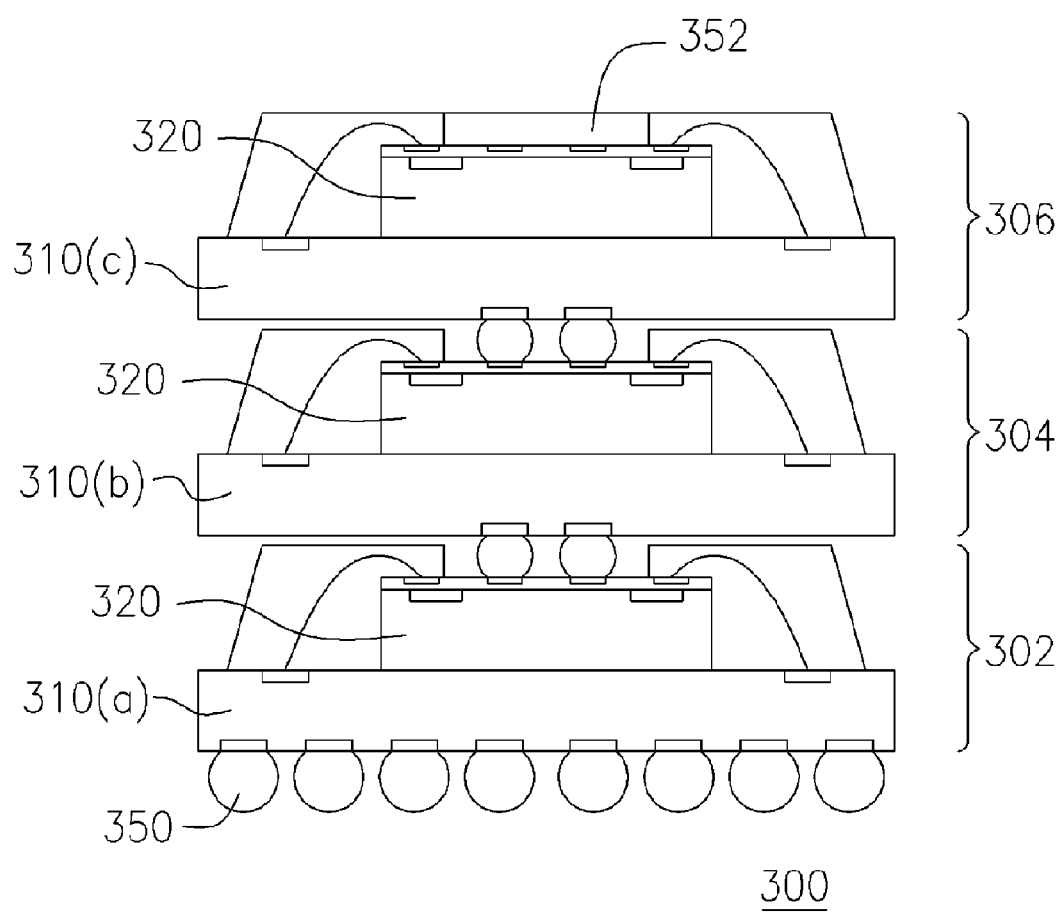

FIG. 3B is an assembled view showing the stacked chip-packaging structure 300. The second to the N'th layers of the chip-packaging units (e.g., 304 and 306) are sequentially stacked up on the first layer of chip-packaging unit 302, where the N can be 2, 3, 4, or more. The solder balls 350 of the second layer of the chip-packaging unit 304 is connected to the outer contacts 328b of the first layer of the chip-packaging unit 304, while the solder balls 350 of the third layer of the chip-packaging unit 306 are connected to the outer contacts 328b of the second layer of the chip-packaging unit 304. Additional layers, if any, of chip-packaging units can be similarly stacked up to form a desirable stacked chip-packaging structure. Apparently, the stacked chip-packaging structure 300 does not need to use a carrier to provide a large supporting area, as in the conventional structure, but rather uses the first layer of the chip-packaging unit 302 for the support. Therefore, the stacked chip-packaging structure 300 of this invention is in a cylinder shape, as opposed to a bar or a flat plate shape of the conventional structures, and the supporting area is substantially reduced to miniaturize the chip-packaging structure.

In addition, each of the chip-packaging units 302, 304 and 306 in the stacked chip-packaging structure 300 of this invention adopts a BGA structure with a high pin count. The adjacent stacked chip-packaging units, (e.g., 302 and 304, or 304 and 306) are electrically connected through solder balls 350 so as to reduce the length of connection between the packaging units and thus to reduce the probability of signal transferring delay. Moreover, a heat dissipating plate 352 can be disposed in the opening 342 of the molding compound 340 of the chip-packaging unit 306 of the top layer of the packaging structure 300. The heat dissipating plate 350 can conduct rapidly the heat from the active surface 322 of the chip 320 to enhance the heat-dissipating efficiency of the chip-packaging structure 300. The opening 342 in the molding compound 340, however, can also be filled up to protect the outer contact points that are not used.

Only one preferred embodiment is described above, but the present invention is by no means limited by the described sizes or types of the chip-packaging units. The chip-packaging units can be in different sizes and types, and each of the chip-packaging units can have a unique function. By adopting the stacked structure of this invention, for example, a plurality of DRAM modules can be disposed on the lowest layer of a logical circuit module or on the top of a central process unit module to obtain a stacked chip-packaging structure with multi-functions and multiplex calculation capacity.

Based on the foregoing, the stacked chip-packaging structure of this invention has the following advantages: (1) The stacked chip-packaging structure of this invention adopts a BGA structure with high pin count, wherein the adjacent stacked chip-packaging units are electrically connected through solder balls to reduce the length of connection between the packaging units and thus reduce the probability of signal transferring delay; and, (2) because of the structural improvements based on this invention, the space occupied by the chip-packaging structure is reduced and thus the entire structure can be miniaturized.

It will be apparent to those skilled in the art that various modifications and variations can be made to the structures of the present invention without departing from the scope or spirit of the invention. In view of the foregoing, it is intended that the present invention covers modifications and variations of this invention provided they fall within the scope of the following claims and their equivalents.

What is claimed is:

1. A chip-packaging stack structure, comprising:
   a plurality of chip-packaging units, suitable for stacking one over another, wherein each of the chip-packaging units comprises:
   a substrate, having a top surface and a corresponding bottom surface, a plurality of upper contacts disposed on the top surface, and a plurality of lower contacts disposed on the bottom surface, wherein the upper contacts are electrically connected to the lower contacts respectively;
   a chip disposed on the top surface of the substrate and having a plurality of inner contacts and a plurality of outer contacts, wherein the inner contacts are electrically connected to the outer contacts respectively;
   a plurality of wires, respectively connected to the upper contacts and the inner contacts;
   a molding compound coveting the wires, the chip and the upper contacts of the substrate, wherein the molding compound has an opening for exposing the outer contacts, and the outer contacts remain exposed on a surface of the chip which also serves as en external surface of the packaging unit; and
   a plurality of solder balls, respectively connected to the lower contacts and being corresponding to the outer contacts of other chip-packaging wilts for electrically connecting the chip-packaging units.

2. The chip-packaging stack structure according to claim 1, wherein the outer contacts are disposed in central area on a surface of the chip, and the inner contacts are disposed in a periphery area on a surface of the chip.

3. The chip-packaging slack structure according to claim 2, wherein the outer contacts are disposed in a surface array distribution.

4. The chip-packaging stack structure according to claim 3, wherein the outer contacts are corresponding to the lower contacts, and the lower contacts we disposed in a surface array distribution in a central area of a surface of the bottom surface.

5. The chip-packaging stack structure according to claim 1, wherein the chip further comprises a plurality of bonding pads and a redistribution layer disposed on a surface of the chip, and the bonding pads are respectively connected trough the redistribution layer to the inner contacts and the outer contacts.

6. The chip-packaging stack structure according to claim 1, wherein the chip further comprises a plurality of bonding pads, a portion of which constitute the inner contacts, and the other portion of which constitute the outer contacts.

7. The chip-packaging stack structure according to claim 1, wherein the chip-packaging units are disposed in a distribution of a ball grid array.

8. The chip-packaging stack structure according to claim 1, wherein the substrate is made of ceramic, glass, or plastics.

9. The chip-packaging stack structure according to claim 1, further comprising a heat dissipating plate, disposed on the top layer of the chip-packaging units and in the opening of the molding compound of the top layer.

10. A chip-packaging unit comprising:
    a substrate, having a top surface and a corresponding bottom surface, a plurality of upper contacts disposed on the top surface, and a plurality of lower contacts disposed on the bottom surface, wherein the upper contacts are electrically connected to the lower contacts respectively
    a chip, disposed on the top surface of the substrate and having a plurality of inner contacts and a plurality of outer contacts;
    a plurality of wires, respectively connected to the upper contacts and the inner contacts; and
    a molding compound, covering the wire; the chip and the upper contacts of the substrate, and having an opening for exposing the outer contacts on a surface of the chip which is an external surface of the chip-packaging unit.

11. The chip-packaging unit according to claim 10, further comprising a plurality of solder balls disposed respectively on the lower contacts.

12. The chip-packaging unit according to claim 10, wherein the chip further comprises a plurality of bonding pads and a redistribution layer disposed on a surface of the chip, and the bonding pads are respectively connected through the redistribution layer to the inner contacts and the outer contacts.

13. The chip-packaging unit according to claim 10, wherein the chip further comprises a plurality of bonding pads and a portion of the bonding pads constitute the inner contacts and the other portion of the bonding pads constitute the outer contacts.

14. The chip-packaging unit according to claim 10, wherein the substrate is made of ceramic, glass, or plastics.

* * * * *